(12) United States Patent
Komatsu (10) Patent No.: US 6,844,921 B2
(45) Date of Patent: Jan. 18, 2005

(54) WAFER HOLDER (75) Inventor: Koji Komatsu, Miyazaki (JP)

(73) Assignee: Oki Electric Industry Co., Ltd., Tokyo (JP)

(*) Notice: Subject to any disclaimer, the term of this patent is extended or adjusted under 35 U.S.C. 154(b) by 52 days.

(21) Appl. No.: 10/259,480

(22) Filed: Sep. 30, 2002

(65) Prior Publication Data
US 2003/0095244 A1 May 22, 2003

(30) Foreign Application Priority Data

Nov. 20, 2001 (JP) ........................................ 2001-354767

(51) Int. Cl.$^7$ ............................ G03B 27/58; G03B 27/62
(52) U.S. Cl. .......................................... 355/72; 355/75
(58) Field of Search ............................ 355/72–76, 53; 310/10, 12; 378/34, 35

(56) References Cited

U.S. PATENT DOCUMENTS

| 5,191,218 | A | * | 3/1993 | Mori et al. | ............ 250/453.11 |
|---|---|---|---|---|---|
| 5,382,311 | A | * | 1/1995 | Ishikawa et al. | ............ 356/345 |
| 5,564,682 | A | | 10/1996 | Tsuji | |
| 5,685,363 | A | * | 11/1997 | Orihira et al. | ................ 165/46 |
| 2001/0033369 | A1 | * | 10/2001 | Matsui | ........................ 355/53 |
| 2002/0008864 | A1 | * | 1/2002 | Kondo | ........................ 355/72 |

FOREIGN PATENT DOCUMENTS

| DE | 10153851.0 | * | 11/2001 |
|---|---|---|---|
| JP | 1-129438 | * | 5/1989 |

* cited by examiner

Primary Examiner—Henry Hung Nguyen
(74) Attorney, Agent, or Firm—Rabin & Berdo, P.C.

(57) ABSTRACT

A wafer holder (20) is capable of preventing foreign matter such as dust from becoming adhered to the wafer. The holder (20) is constituted by providing a wafer supporting portion (13) at one disk surface of a disk-shaped substrate portion (12), with the wafer supporting portion (13) having a ring shape with the smallest possible width over which the peripheral portion of the wafer (10) can be supported. Even if there is foreign matter present on the wafer holder or there is dust/deposit film adhering to the rear surface of the wafer, it is possible to prevent the occurrence of a local resist pattern defect by ensuring that the height of the wafer surface including the resist layer remains unchanged.

8 Claims, 7 Drawing Sheets

WAFER HOLDER

BACKGROUND OF THE INVENTION

The present invention relates to a wafer holder which is utilized in a reduction projection exposure apparatus (hereafter referred to as a stepper) or the like in a semiconductor manufacturing process.

DESCRIPTION OF THE RELATED ART

Exposure apparatuses such as steppers and scanners are employed to form a desired pattern in a resist layer applied onto a wafer in a photolithography process in the related art.

In a stepper, a circuit pattern drawn on a glass mask is projected and exposed onto a wafer having a photoresist applied thereto which is positioned on a wafer holder provided on an XY stage. In the exposure processing, since the range of exposure achieved with a single shot is limited by the size of the glass mask and the projection magnification factor, the wafer is alternately exposed and then moved while adjusting the focal point so as to maintain the height of the wafer surface including the resist layer at a consistent level at all times to form the pattern over the entire wafer.

Some exposure apparatuses such as reduction projection exposure apparatuses employed in integrated circuit production in recent years include a leveling mechanism that corrects a local tilt of a photosensitive substrate relative to the projected image plane by utilizing an exposure projection optical system.

Since a projection lens having a large numerical aperture is used in a reduction projection exposure apparatus employed in integrated circuit production, which transfers a reduced image of a pattern on a reticle onto a wafer, under normal circumstances, the focal depth is extremely small. For this reason, it is necessary to hold the wafer exposure area perpendicular to the optical axis of the projection lens with a high degree of accuracy, i.e., to hold the wafer surface perfectly parallel to the projected image plane and, at the same time, to position the wafer along the optical axis with an auto focus mechanism. However, since the wafer does not always achieve perfect flatness, a leveling mechanism that corrects a local tilt is provided so as to set the exposure target surface corresponding to each exposure shot perpendicular to the optical axis of the projection lens (see Japanese Unexamined Patent Publication No. 1983-113706, for instance).

In a leveling mechanism in the related art, a circular light flux with low intensity, which is inscribed on a rectangular exposure pattern area to undergo exposure on a wafer, for instance, is diagonally irradiated onto the wafer, and the reflected light from the light flux is condensed at the condenser lens to be then guided onto a detector constituted of a light-receiving element divided into four sections and the like. The extent of the tilt of the current exposure target surface is measured in conformance to the position of the center of the condensed light on the detector and the surface tilt is corrected so as to adjust the extent of the tilt to a preset value within a specific allowable error range. The surface tilt may be corrected by, for instance, supporting the wafer at three points on a leveling stage and adjusting the height at two points among the three points. Subsequently, the wafer is positioned along the optical axis of the projection lens by the auto focus mechanism as necessary.

In the leveling mechanism in the related art, the tilt is normally adjusted so as to uniformly reset the measured value representing the tilt of the exposure target surface to a specific value regardless of the position of the exposure shot within the wafer. In addition, as the flatness at the periphery of the wafer usually tends to be poor due to sagging, an adjustment method in which an adjustment is made by setting a measurement disallowed area at the periphery and adopting that the exposure target surfaces in this area manifest a tilt to, for instance, a predetermined extent without using any values obtained through tilt measurement is sometimes adopted.

As described above, the leveling mechanism performs an adjustment so as to flatten the wafer exposure surface by controlling the leveling stage even when the wafer exposure surface is not completely flat. As a result, even if the wafer surface manifests a degree of flexure, the wafer surface can be leveled through the leveling process described above to an extent that no problem occurs when exposing the wafer exposure surface.

However, the required degree of flatness cannot always be assured through the leveling adjustment. For instance, foreign matter may adhere due to the resist applied onto the peripheral portion of the wafer. If such foreign matter enters the space between the wafer and the wafer holder, the surface of the wafer becomes locally distended due to the presence of the foreign matter, which results in defocusing and the occurrence of a smudge or the like in the exposed pattern. Thus, it is necessary to provide a wafer holder capable of preventing entry of foreign matter.

Accordingly, various wafer holders are considered next.

Figure 6A:
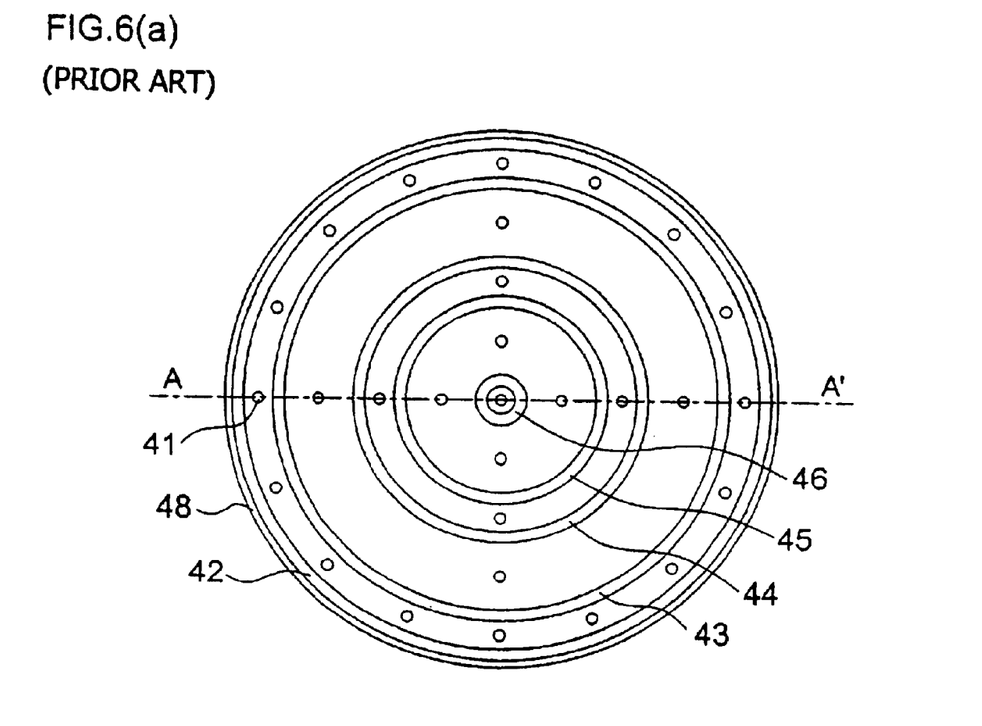
FIGS. 6(a) and 6(b) show a groove type wafer holder in the related art.
Figure 6B:
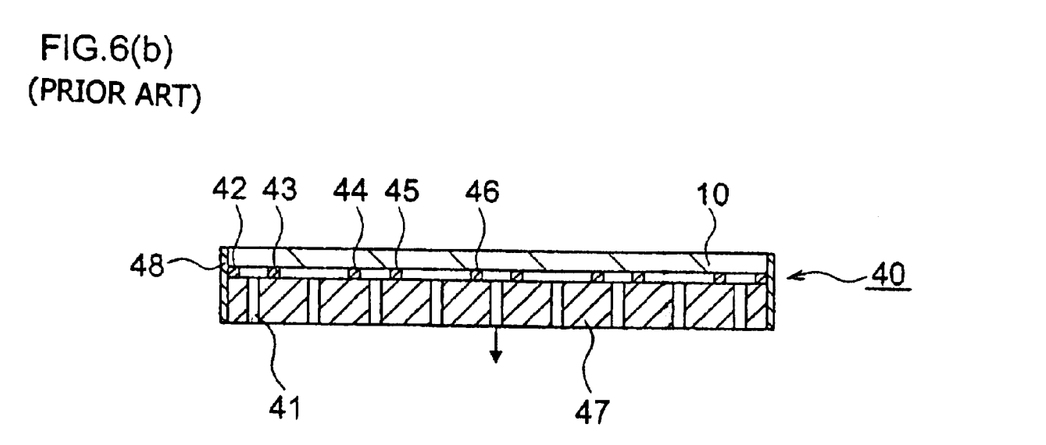
Figure 7A:
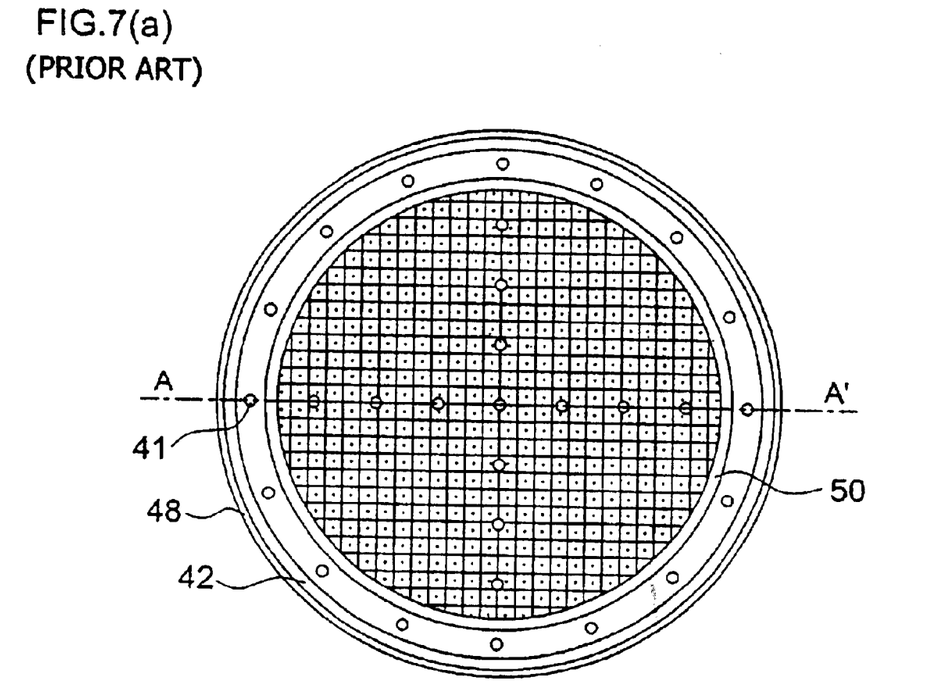
FIGS. 7(a) and 7(b) show a pin type wafer holder in the related art.
Figure 7B:
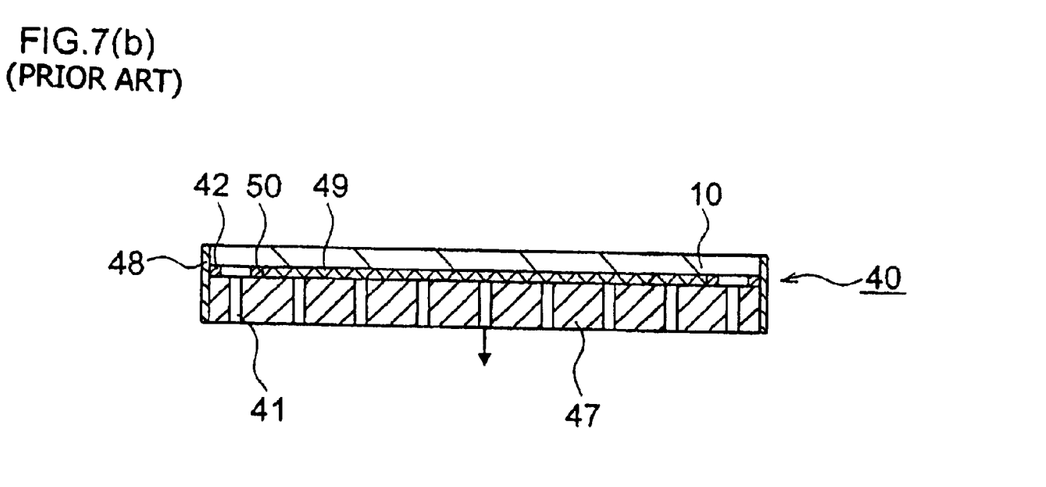

FIGS. 6 and 7 present schematic illustrations of wafer holders in the related art utilized in the exposure apparatus described above, which is a stepper.

FIG. 6 shows a groove type wafer holder in the related art. FIG. 6(a) presents a plan view, and FIG. 6(b) presents a sectional view through A–A' in FIG. 6(a), with a wafer placed on the wafer holder in FIG. 6(b) to simplify the explanation.

A groove type wafer in the related art includes suction holes 41 formed over specific intervals at a disk-shaped substrate portion 47 to achieve a cross pattern to hold the wafer through suction, wafer supporting portions 42~46 formed as concentric circles having different radii and a guide 48 provided at the circumference of the substrate portion 47 to prevent the wafer from becoming offset along the lateral direction.

The wafer holder 40 having the concentric wafer supporting portions 42~46 which are densely set over a small pitch in order to minimize the extent of deformation of the wafer occurring when the wafer becomes suction held onto the wafer holder poses a very serious disadvantage in that foreign matter such as dust is allowed to enter the wafer holding portions 42~46 ranging over significantly large areas. In addition, even if there is no dust or the like, the mounting surface of the wafer holder 40 must assure an extremely high degree of flatness in order to align the wafer with the focal plane. However, it requires a great deal of time and expense to machine all the wafer supporting portions 42~46 so as to achieve the required high degree of flatness at the wafer supporting portions 42~46.

Wafer holders in the related art include the following example as well.

FIG. 7 shows a pin type wafer holder in the related art. FIG. 7(a) presents a plan view, and FIG. 7(b) presents a sectional view through A–A' in FIG. 7(a), with a wafer placed on the wafer holder in FIG. 7(b) to simplify the explanation.

The wafer holder 40 includes suction holes 41 formed at a disk-shaped substrate portion 47 over specific intervals to achieve a cross pattern so as to hold fast a wafer through suction, wafer supporting portions 42 and 50 formed as concentric circles having different radii, pin portions 49 formed in the area further inward relative to the wafer supporting portion 50 and providing point support for the wafer 10 with a small contact area and a guide 48 adjacent to the substrate portion 47 and the supporting portion 42.

The pin portions 49, each constituted of a conically projecting pin, are arrayed in alignment over the entire area further inward relative to the wafer supporting portion 50.

This pin type wafer holder, too, poses a serious problem in that the wafer supporting portions 42 and 50 and the pin portions 49, ranging over considerable areas, allow foreign matter such as dust to enter.

The focal depth is becoming increasingly small, particularly in the photolithography process during which very fine patterns are exposed and transferred onto a substrate among various semiconductor production processes as elements are becoming further miniaturized, and the practical depth has already been reduced to him or less. When the process margin, which should be allowed in element production, is taken into consideration, a wafer which is correctively flattened on the wafer holder needs to be flattened to achieve a degree of flatness of at least approximately $\frac{1}{5} \sim \frac{1}{10}$ of the focal depth. A particularly vital function required of the wafer holder is the ability to correctively flatten even a wafer having undergone a process and manifesting warp over the entire surface including the wafer periphery. At present, bare wafers manifesting warp of 100 $\mu$m and processed wafers having a thin film formed thereupon which manifest warp exceeding 200 $\mu$m are not unusual. A warped wafer is correctively flattened by a wafer holder by using the atmospheric pressure which presses down the wafer manifesting an upward warp from above. It is particularly important to assure a high vacuum state at the periphery of the wafer holder when handling a processed wafer which tends to manifest warp at the periphery. A full correction capability at the periphery is not assured by wafer holders in the related art.

Since a very small focal depth of $\pm 1$ $\mu$m is achieved at the front surface in a 15×15 mm exposure target area, the entire surface of a given area on the substrate to be exposed needs to be accurately aligned with the optimal image-forming plane of the projection lens. However, since approximately several $\mu$m of local warp and unevenness and approximately several tens of $\mu$m of warp and unevenness over the entire surface manifest at the wafer and the glass plate, a pattern cannot be exposed with good resolution without addressing the presence of such warp and unevenness.

Accordingly, the wafer is correctively flattened by the wafer holder. The wafer holder, which is formed in a disk shape by using a metal material or a ceramic material having a thickness which is sufficiently larger than the thickness of the wafer, includes a mounting surface formed in a round shape having a diameter somewhat smaller than the diameter of the wafer.

In addition, since the through holes provided for lift pins do not form vacuum space, portions of the wafer over the through holes cannot be correctively flattened through suction in a substrate suction holding device in the related art. In this case, the flatness at the portions of the wafer over the through holes is directly affected by the flatness at the areas surrounding the through holes that are vacuum held. Through experience, it has been learned that the vacuum held wafer tends to manifest local rises over the through holes. In addition, the wafer is lifted at the periphery as well. These local rises present a serious obstacle to achieving the desired degree of flatness and furthermore, the wafer becomes distorted along the planar direction as well over these rises to further distort the transferred and exposed image.

These rises and lifted areas, are attributed to the flexure of the projected portions of the wafer holder which are subjected to a compressive force when the wafer is vacuum held onto the wafer holder. In particular, if there is a difference between the extent of flexure manifesting at the projected portions set close to each other and the extent of flexure manifesting at their edges, the wafer becomes locally distorted to manifest rises and lifted areas.

The effort to minimize the contact area over which the wafer holder is placed in contact with the wafer in order to reduce the likelihood of entry of foreign matter into the space between the wafer holder and the wafer has intensified in recent years, and as a result, a the individual projected portions have become more pointed. At the same time, it is necessary to reduce the length of time elapsing before the substrate becomes completely vacuum held by an order of $\frac{1}{100}$ sec when a wafer holder is utilized in a semiconductor manufacturing apparatus. For this reason, a large gap must be allowed between the wafer and the indented portions of the wafer holder, i.e., a large height must be allowed at the projected portions, so as to assure a high enough evacuating speed while keeping down the evacuating resistance when vacuum holding the wafer onto the wafer holder. Since this is bound to increase the aspect ratio of the projected portions and increase the extent of flexure attributable to the compressive force, the local deformation of the wafer becomes even more pronounced as a result.

In a vacuum holding device in the prior art, warp or deformation of a sample can be correctively flattened by vacuum holding the sample onto the upper surfaces of the projected portions and the land portions of the vacuum-holding unit through evacuation. In addition, since the use of the projected portions allows the contact area over which the vacuum holder and the sample come in contact with each other to be minimized, hardly any reduction in the degree of flatness, which is attributable to dust and the like, occurs. However, if the sample is only supported by the projected portions in this structure, the vacuum-holding unit is allowed to communicate with the outside and thus, a sufficient degree of suction for holding the sample is not achieved, and, at the same time, as the external air and a processing fluid are taken into the vacuum-holding unit, the sample and the vacuum holder become contaminated. Accordingly, land portions are formed to vacuum seal the vacuum-holding unit in the related art. While it is necessary to form the land portions over a large width to achieve good vacuum sealing, the likelihood of dust and the like becoming adhered to the upper surfaces of the land portions becomes higher as their width increases, posing a problem in that the peripheral portion of the sample cannot be correctively flattened with a high degree of accuracy.

If foreign matter such as dust becomes adhered to the wafer contact area of any of the wafer holders described above or if a deposit film that will locally alter the wafer thickness becomes adhered to the rear surface of the wafer itself, the resist film surface is caused to rise above the flat plane by the foreign matter or the deposit film. Since focusing is achieved by adopting that the wafer surface is completely flat, the projected image becomes locally defocused in the situation described above, resulting in formation of a defocused resist pattern.

SUMMARY OF THE INVENTION

An object of the present invention is to provide a wafer holder that is capable of minimizing the adverse effect of the presence of foreign matter such as dust on a wafer by addressing the problems discussed above.

In order to achieve the object described above, the present invention adopts the following means for solving the problems.

The wafer holder includes a disk-shaped substrate portion where a wafer supporting portion adopting a specific shape that supports a disk-shaped wafer only at its peripheral portion from the rear surface of the wafer is formed. The wafer supporting portion may be constituted as, for instance, a ring having the smallest possible width over which the peripheral portion of the wafer can be supported.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments

EXPLANATION OF REFERENCE NUMERALS 10 wafer
11 suction hole
12 substrate portion
13, 15 wafer supporting portion
14 guide
16 wafer retainer
20 wafer holder

DETAILED DESCRIPTION OF THE PREFERRED EMBODIMENTS

The following is a detailed explanation of the preferred embodiments of the wafer holder according to the present invention, given in reference to the attached drawings. It is to be noted that the same reference numerals are assigned to components achieving essentially identical functions and structural features to preclude the necessity for a repeated explanation thereof.

(First Embodiment)

Figures 1A, 1B:
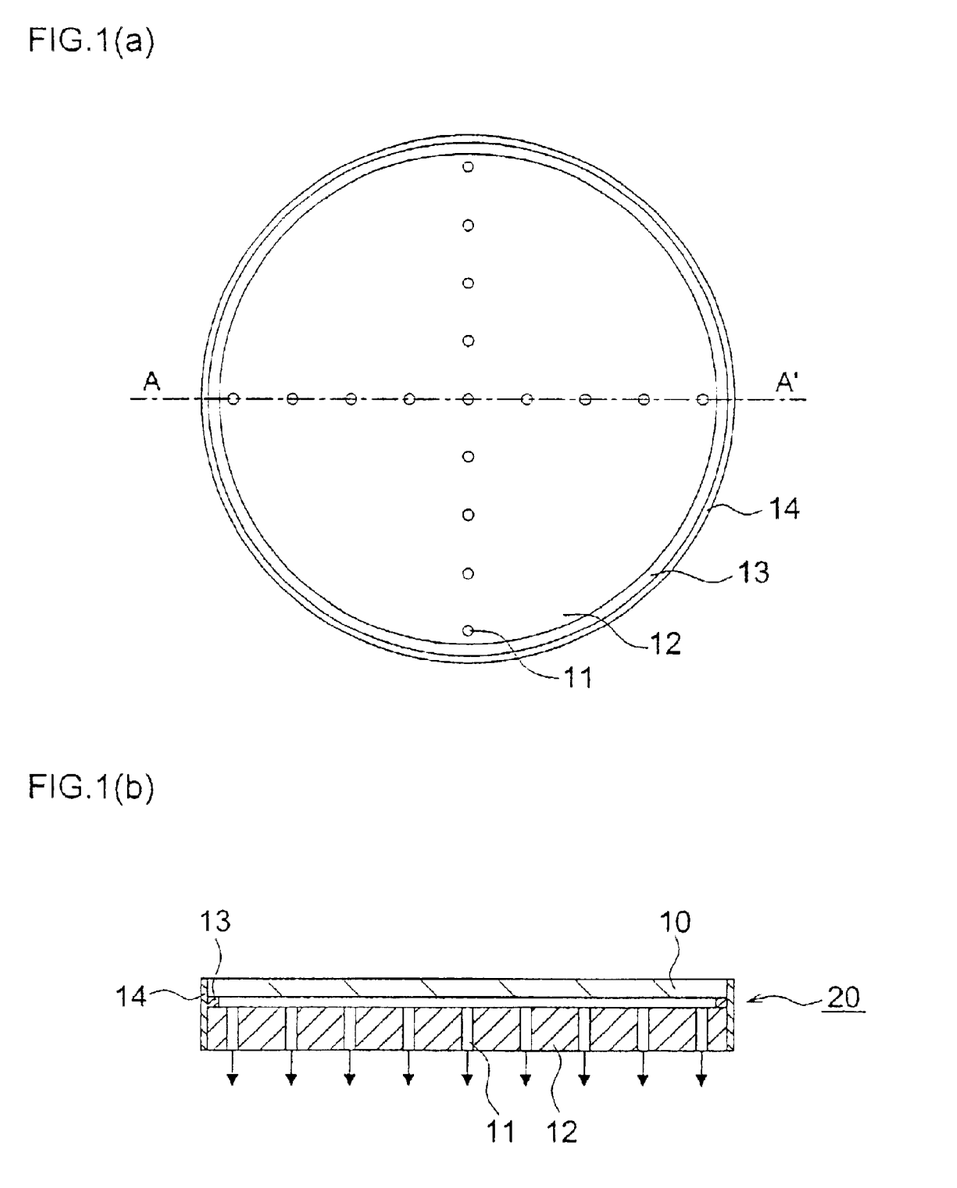
FIGS. 1(a) and 1(b) illustrate the structure of the wafer holder achieved in a first embodiment.

FIG. 1 shows the structure adopted in the first embodiment. FIG. 1(a) presents a plan view of the wafer holder and FIG. 1(b) presents a sectional view taken along A–A' in FIG. 1(a), with a mounted wafer also included in the illustration in FIG. 1(b) to facilitate the explanation.

The wafer holder 20 in FIG. 1 includes a disk-shaped substrate portion 12 where suction holes 11 and a wafer supporting portion 13 are formed and a guide 14. The suction holes 11 are formed so as to pass through the substrate portion 12 over specific intervals in a cross pattern to function as air-drawing holes during a pressure reducing operation. The wafer supporting portion 13, having an upper surface thereof flattened in order to support a wafer 10, is basically formed in a ring shape with the smallest possible width over which the peripheral portion of the wafer 10 can be supported without allowing foreign matter to enter between the wafer and the wafer holder. The guide 14, which is formed in a ring shape an in contact with the outer side surface of the substrate portion 12 and the side surface of the wafer supporting portion 13, prevents the wafer 10 from shifting in the planar direction.

The wafer and the wafer holder 20, and more specifically, the wafer 10 and the wafer supporting portion 13, come into contact with each other only at the external circumferential side of the wafer 10 and thus, the area within the wafer 10 where the resist pattern is formed is not supported by the supporting portion 13. Namely, the wafer 10 is allowed to flex into a state which its central area is slightly sagged.

(Mounting the Wafer)

The wafer 10 is mounted over the wafer supporting portion 13 of the wafer holder 20 and evacuation is implemented through the suction holes 11. Through this evacuation process, the wafer 10 is firmly positioned at the wafer supporting portion 13. While the wafer 10 is allowed to flex and the central area of the wafer 10 is slightly sagged in this state, exposure can be performed with no problem by utilizing the leveling mechanism of a stepper or the like as long as there is no foreign matter such as dust.

(Advantage of the First Embodiment)

By using the wafer holder 20 shown in FIG. 1, the height of the wafer surface including the resist layer can remain unchanged to prevent occurrence of a local resist pattern defect even when there is foreign matter present on the wafer holder 20 or there is dust/deposit film or the like present at the rear surface of the wafer.

(Second Embodiment)

Figures 2A, 2B:
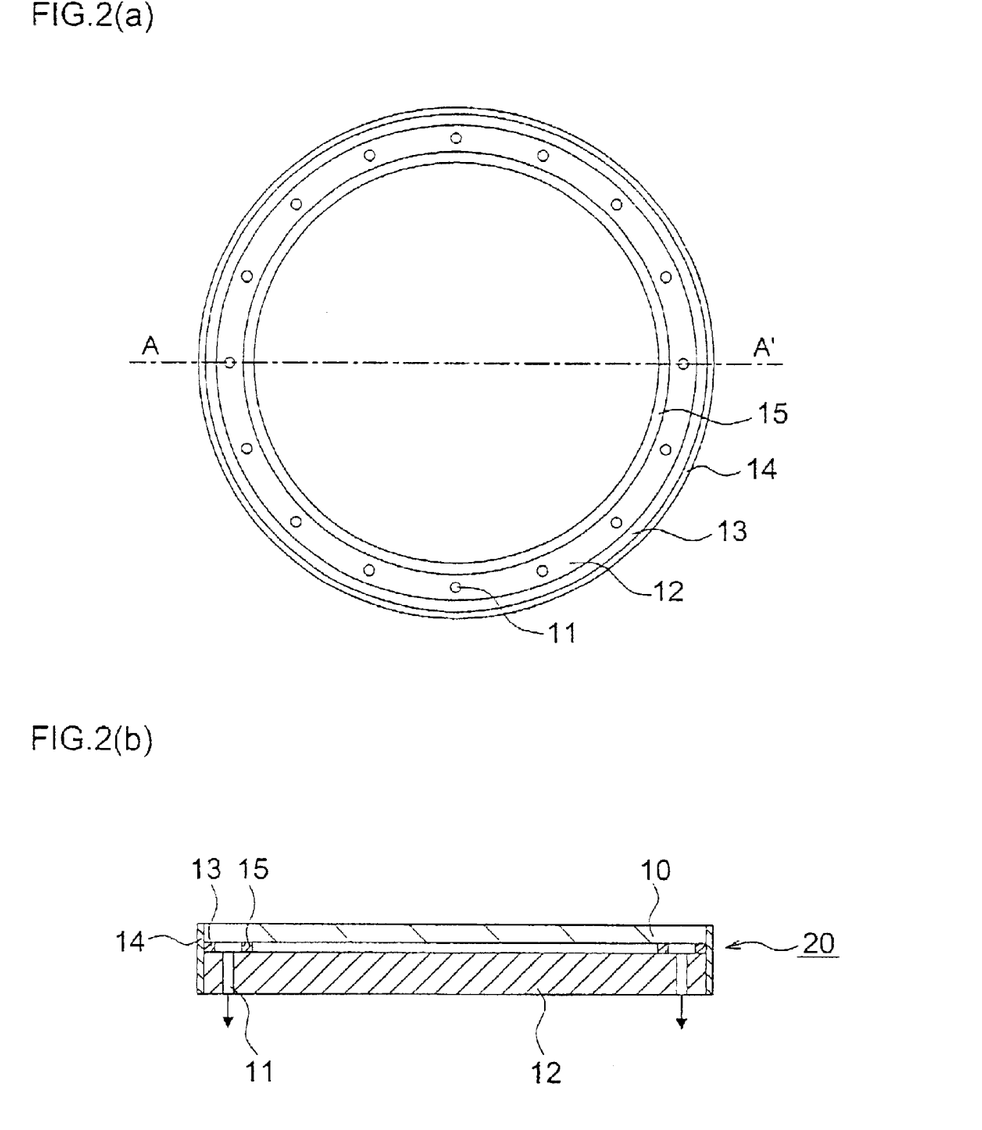
FIGS. 2(a) and 2(b) illustrate the structure of the wafer holder achieved in a second embodiment.

FIG. 2 shows the structure adopted in the second embodiment. FIG. 2(a) presents a plan view of the wafer holder 20 and FIG. 2(b) presents a sectional view taken along A–A' in FIG. 2(a), with a mounted wafer also included in the illustration in FIG. 2(b) to facilitate the explanation.

The wafer holder 20 in FIG. 2 includes a disk-shaped substrate portion 12 having wafer supporting portions 13 and 15 and a plurality of suction holes 11 provided therein and a guide 14.

The wafer supporting portions 13 and 15, which are formed as concentric rings with different radii, each have a flat upper surface so as to support the wafer 10. The supporting portion 13 is formed along the external circumference of the wafer 10, whereas the supporting portion 15 is formed at a position so as to form, together with the supporting portion 13, a space continuous to the suction holes 11. The guide 14, which is formed in of ring shaped in contact with the outer side surface of the substrate portion 12 and the side surface of the wafer supporting portion 13, prevents the wafer 10 from shifting in the planar direction.

The suction holes 11 are formed so as to pass through the substrate portion 12 over specific intervals along the wafer supporting portions 13 and 15 over the area ranging between the wafer supporting portions 13 and 15 to function as air-drawing holes during a pressure reducing operation. The wafer holding portion 15 is provided further inward relative to the suction holes 11 at the holder so that only the peripheral portion of the wafer 10 is held down.

While the contact area over which the wafer 10 comes in contact with the wafer holder, i.e., at wafer supporting portions 13 and 15, increases compared to the first embodiment, a narrow band-like circumferential area of the wafer alone is held down in the second embodiment shown in FIG. 2 unlike in the first embodiment in which the entire wafer surface is held down. As a result, since the wafer is held down over a ring-shaped area ranging over a uniform width, a uniform suction force is applied to the wafer, and with the wafer supported at the two ring shaped supporting portions, warp/deformation of the wafer caused by the suction force can be minimized.

In addition, as the pressure is reduced through the suction holes 11, the negative pressure which is applied to the space formed by the two wafer supporting portions 13 and 15 and the wafer 10 works uniformly in the space during the pressure reducing operation. Thus, since the negative pressure applied to part of the wafer 10 still works uniformly, the extents of warp/deformation of the wafer 10 attributable to the hold-down stress can be reduced.

It is to be noted that one of the two wafer supporting portions, i.e., the wafer supporting portion 15, may be omitted. In such a case, the effect of the pressure reduction achieved through the suction holes 11 works over the entire surface of the wafer 10.

(Mounting the Wafer)

The wafer 10 is mounted over the wafer supporting portion 13 of the wafer holder 20 and evacuation is implemented through the suction holes 11. Through this evacuation process, the wafer 10 is firmly positioned at the wafer supporting portions 13 and 15. While the wafer 10 flexes to allow the central area of the wafer 10 to sag slightly in this state, exposure can be performed with no problem by utilizing the leveling mechanism of a stepper or the like as long as there is no foreign matter such as dust.

(Advantages of the Second Embodiment)

As in the first embodiment, the contact area over which the holder comes in contact with the wafer 10 is reduced compared to the wafer holders in the related art and, as a result, a local pattern defect caused by the presence of foreign matters such as dust can be prevented. In addition, while the wafer supporting portion 13 is provided only at the peripheral portion and the state of tilt at the surface of the wafer 10 may, therefore, change on the inside (near the center) where no means for support is present in the first embodiment, the wafer 10 is supported at the two wafer supporting portions 13 and 15 formed as rings with different radii in the second embodiment so as to minimize the occurrence of warp/deformation of the wafer caused by the suction force although the wafer is held down only at its periphery in the second embodiment.

(Third Embodiment)

Figure 3A:
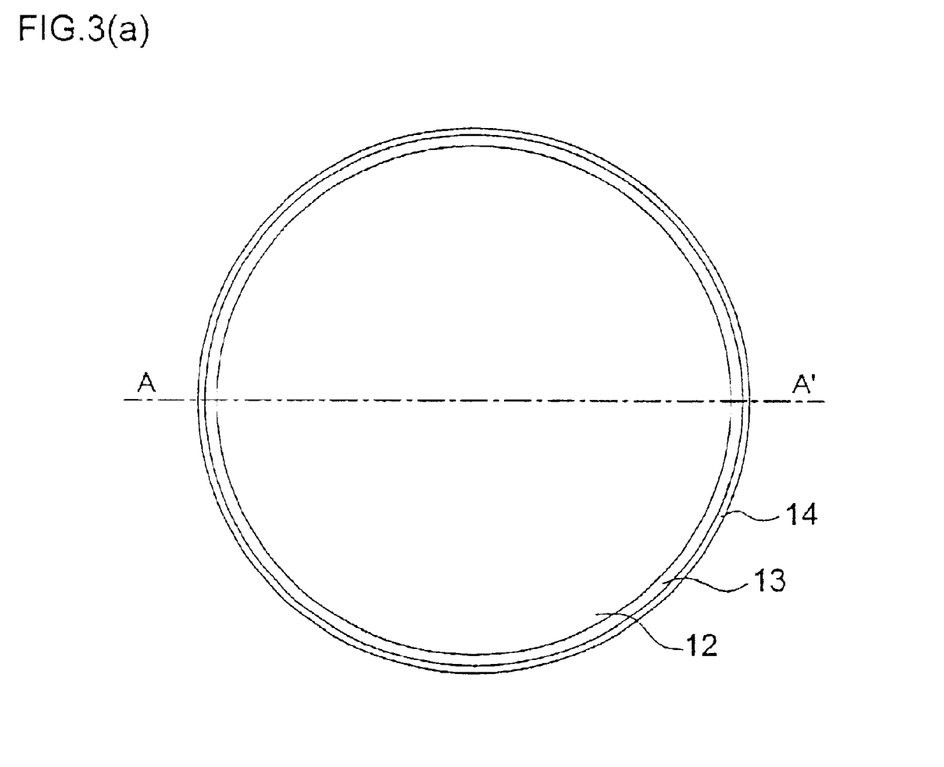
FIGS. 3(a) and 3(b) illustrate the structure of the wafer holder achieved in a third embodiment.
Figure 3B:
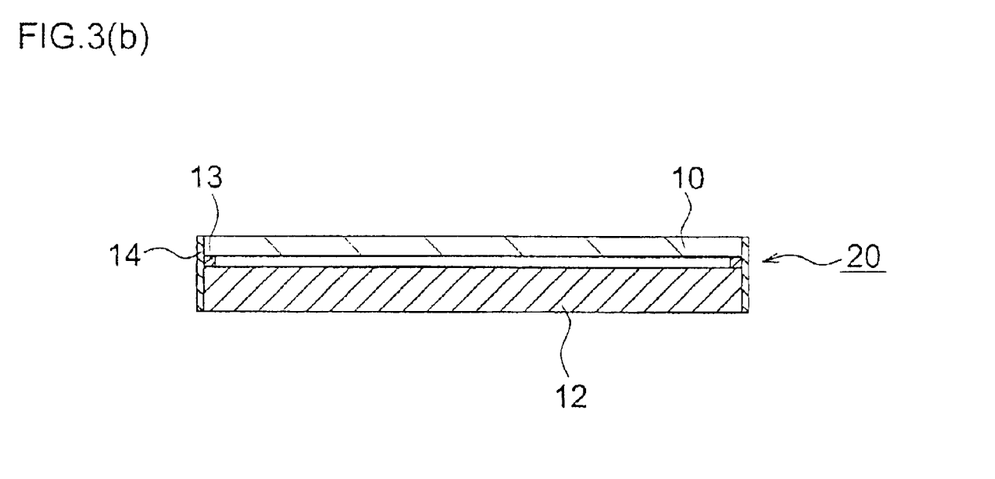

FIG. 3 shows the structure adopted in the third embodiment.

FIG. 3(a) presents a plan view of the wafer holder and FIG. 3(b) presents a sectional view taken along A–A' in FIG. 3(a), with a mounted wafer also included in the illustration in FIG. 3(b) to facilitate the explanation.

The third embodiment shown in FIG. 3 is characterized in that, unlike the first and second embodiments illustrated in FIGS. 1 and 2 and the examples of the related art illustrated in FIGS. 6 and 8, it does not include any suction holes at which the wafer is held fast and is provided only with a ring-shaped wafer supporting portion 13 formed over the peripheral portion of the substrate portion 12.

The wafer holder 20 includes the disk-shaped substrate portion 12 where the wafer supporting portion 13 is formed and a guide 14. The wafer supporting portion 13, having an upper surface thereof flattened in order to support the wafer 10, is basically formed in a ring shape with the smallest possible width over which the peripheral portion of the wafer 10 can be supported without allowing foreign matter to enter between the wafer and the wafer holder. The guide 14, which is formed in a ring shape and in contact with the outer side surface of the substrate portion 12 and the side surface of the wafer supporting portion 13, prevents the wafer 10 from shifting in the planar direction.

Since the area over which the resist pattern is to be formed toward the center of the wafer 10 is free, as in the second embodiment, the wafer 10 which is not secured through suction is simply placed over the wafer supporting portion 13 provided toward the external circumference.

(Mounting the Wafer)

The wafer 10 is mounted on the wafer supporting portion 13 at the wafer holder 20. Through this evacuation process, the wafer 10 is firmly positioned at the wafer supporting portions 13 and 15. While the wafer 10 is allowed to flex and the central area of the wafer 10 is slightly sagging in this state, a exposure can be performed with no problem by utilizing the leveling mechanism of the stepper or the like as long as there is no foreign matter such as dust.

(Advantages of the Third Embodiment)

The third embodiment achieves an advantage similar to that realized in the first embodiment, in that the height of the wafer surface including the resist layer can remain unchanged to prevent occurrence of a local resist pattern defect even when there is foreign matter present on the wafer holder 20 or there is dust/deposit film or the like adhering to the rear surface of the wafer 10.

In addition, since the wafer is held through suction, no inconsistency in the surface height manifesting together with warp of the wafer 10 due to a suction holding force occurs. Furthermore, unlike in the second embodiment, the contact area over which the wafer holder 20 and the wafer 10 come in contact with each other is not reduced, and thus, the occurrence of a local focus error can be more effectively prevented.

(Fourth Embodiment)

Figure 4A:
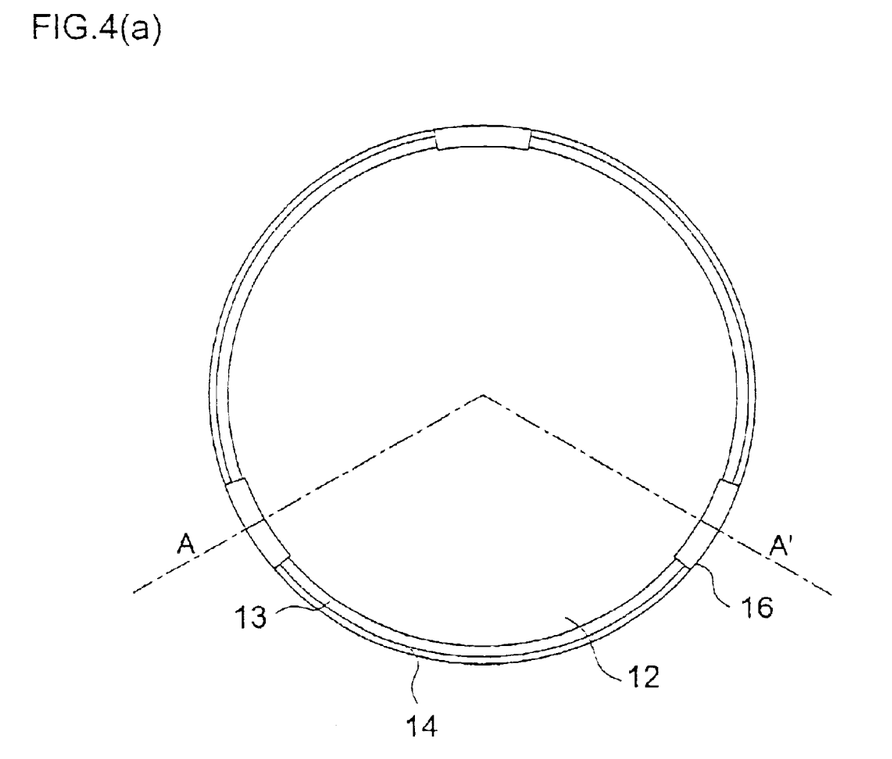
FIGS. 4(a) and 4(b) illustrate the structure of the wafer holder achieved in a fourth embodiment.
Figure 4B:
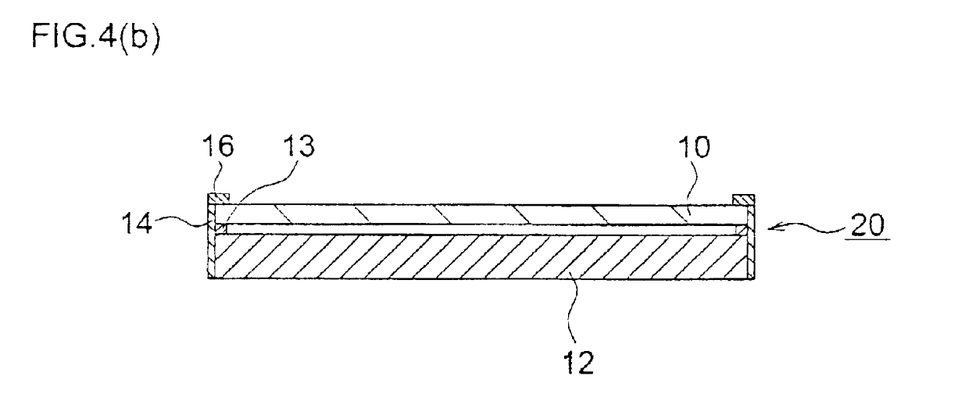

FIG. 4 shows the structure adopted in the fourth embodiment.

FIG. 4(a) presents a plan view of the wafer holder and FIG. 4(b) presents a sectional view taken along A–A' in FIG. 4(a), with a mounted wafer also included in the illustration in FIG. 4(b) to facilitate the explanation below.

The wafer holder 20 in FIG. 4, which, like the wafer holder in the third embodiment shown in FIG. 3, does not include any suction holes for vacuum holding the wafer, is characterized in the that three or more wafer retainers 16 for securely holding the wafer 10 are provided in the peripheral portion.

The wafer holder 20 includes a disk-shaped substrate portion 12 where a wafer supporting portion 13 is formed and a guide 14. The wafer supporting portion 13, having an upper surface thereof flattened in order to support the wafer 10, is basically formed in a ring shape with the smallest possible width over which the peripheral portion of the wafer 10 can be supported without allowing foreign matter to enter between the wafer and the wafer holder. The guide 14, which is formed in a ring shape and in contact with the outer side surface of the substrate portion 12 and the side surface of the wafer supporting portion 13, prevents the wafer 10 from shifting in the planar direction.

As in the first embodiment, the wafer 10 is supported only over its periphery by the wafer supporting portion 13, and the inner area of the wafer 10 toward the center over which the resist pattern is to be formed is not supported by any corresponding means for support.

The wafer retainers 16, each formed in a shape achieved by cutting out part of a ring shape with a width over which the wafer 10 can be supported at its periphery, are provided over a specific distance from each other along the external circumference of the wafer 10. The quantity and the positions of the wafer retainers 16 are determined by ensuring that the surface of the wafer 10 is not allowed to become locally warped when the wafer becomes supported. In this embodiment, three wafer retainers 16 are provided over a uniform distance from each other on the circumference. However, two or fewer wafer retainers or four or more wafer retainers 16 may be provided, instead.

While the inside of the wafer holder 20 is free due to the absence of the wafer supporting portion 13 in the fourth embodiment as in the first embodiment, the wafer 10 is crimped and secured onto the wafer holder 20 by the wafer retainers 16 which may be clamps.

(Mounting the Wafer)

The wafer 10 is mounted onto the wafer supporting portion 13 of the wafer holder 20 and is then held down from above by the wafer retainers 16. Even in this state, that 10 may become flexed to allow its central area to sag. However, exposure can be performed without any problem by employing the leveling mechanism of a stepper or the like, as long as there is no foreign matter such as dust.

(Advantages of the Fourth Embodiment)

An advantage similar to that realized in the first embodiment is achieved in the fourth embodiment in that even if there is foreign matter present on the wafer holder 20 or dust/deposit film adhering onto the rear surface of the wafer, the means for support such as the wafer supporting portion 13 and the wafer retainers 16 provided so as to set their contact positions toward the wafer periphery ensure that the occurrence of a local resist pattern defect is reduced by sustaining the height of the wafer surface including the resist layer at a constant level.

In addition, since the wafer 10 is not vacuum held, no inconsistency in the surface height attributable to wafer warp caused by the suction holding force occurs. Furthermore, unlike in the third embodiment, the wafer 10 is not allowed to move even slightly as the XY stage moves at high speed since it is crimped and secured by clamps or the like, and thus, the occurrence of local focus error can be prevented even more effectively.

(Fifth Embodiment)

Figure 5A:
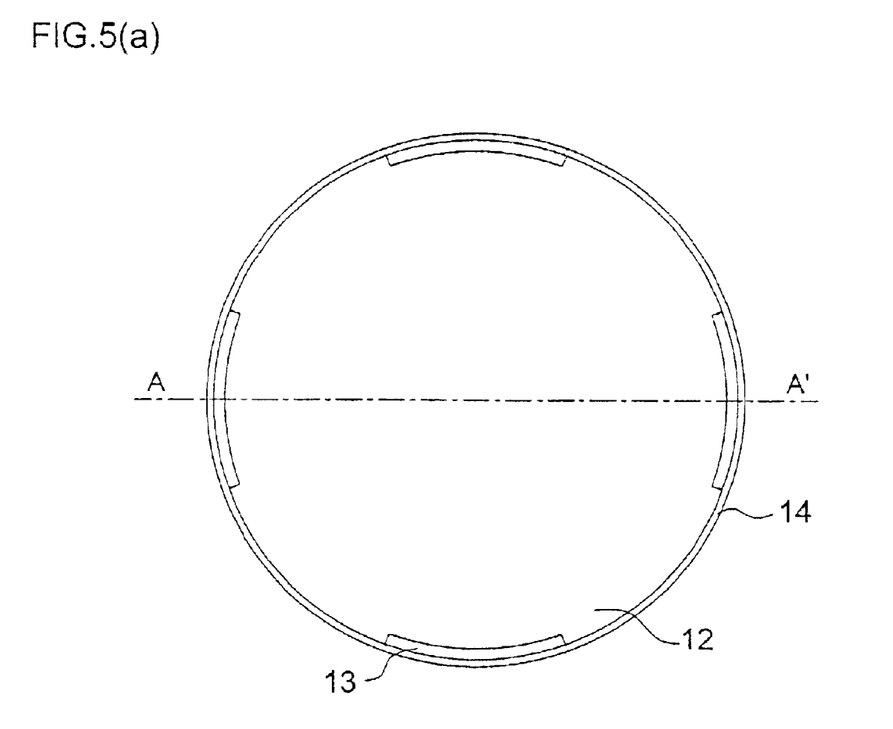
FIGS. 5(a) and 5(b) illustrate the structure of the wafer holder achieved in a fifth embodiment.
Figure 5B:
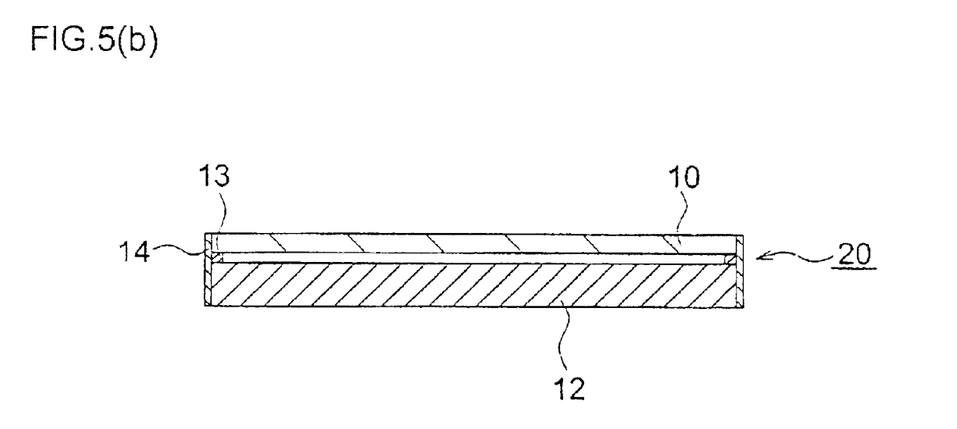

FIG. 5 shows the structure adopted in the fifth embodiment.

FIG. 5(a) presents a plan view of the wafer holder and FIG. 5(b) presents a sectional view taken along A–A' in FIG. 5(a), with a mounted wafer also included in the illustration in FIG. 5(b) to facilitate the explanation.

The fifth embodiment differs from the third embodiment in that its wafer supporting portion 13 is constituted of circular arcs obtained by cutting out portions of a ring with the smallest possible width over which the wafer 10 can be supported over its external circumference, with the circular arcs provided over specific intervals from each other along the external circumference of the wafer 10.

In this structure, the shape and the positions of the circular arcs constituting the wafer supporting portion 13 are selected to ensure that the wafer can be held level. In the figure, the wafer supporting portion 13 is provided at four positions over a uniform distance from each other along the external circumference of the wafer. However, it may be provided at three positions or fewer or may be provided at five or more positions.

(Mounting the Wafer)

The wafer 10 is mounted on the wafer supporting portion 13 at the wafer holder 20. While the wafer 10 flexes and the central area of the wafer 10 sags slightly in this state, exposure can be performed with no problem by utilizing the leveling mechanism of a stepper or the like as long as there is no foreign matter such as dust.

(Advantages of the Fifth Embodiment)

The fifth embodiment achieves advantages similar to those realized in the third embodiment. In addition, since there is an interval between the individual circular arcs constituting the wafer supporting portion 13, the heat inside the wafer holder 20 can be released with ease.

(Another Mode of Application)

While an explanation is given in reference to the first~fifth embodiments on an example in which the present invention is adopted in a stepper, it may be adopted in a wafer holder used in an apparatus (reflector type projection exposure apparatus) that transfers a glass mask projection image over a specific area onto a resist layer during a photolithography process, instead.

As explained above, the wafer holder according to the present invention makes it possible to minimize the adverse effect of the presence of foreign matter such as dust on the wafer.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

What is claimed is:

1. A wafer holder comprising:
   a disk-shaped substrate;
   a supporting portion to support a wafer on said substrate, which is located along an edge of said substrate, and has a predetermined width from the edge of said substrate; and
   a wafer retainer that prevents the front surface of said wafer from moving,
   wherein said supporting portion is constituted of a plurality of circular arcs obtained by cutting out portions of a ring, and
   said wafer retainer adopts a shape obtained by cutting out a portion of a ring with a width over which the peripheral portion of said wafer can be supported and is provided at positions distanced over a predetermined interval from each other along the external circumference of said wafer.

2. The wafer holding according to claim 1, wherein said supporting portion is constituted of at least four circular arcs.

3. The wafer holder according to claim 1, further comprising:
   pressure-reducing suction holes provided on said substrate, which pass through said substrate.

4. A wafer holder according to claim 1, wherein:

said suction holes are formed over predetermined intervals along a cross pattern.

5. A wafer holder according to claim 4, wherein:

said suction holes are formed toward the periphery of said wafer supporting portion.

6. A wafer holder according to claim 1, wherein:

said wafer retainer is provided at three positions set over a uniform distance from each other along the external circumference of said wafer.

7. A wafer holder according to claim 1, further having:

a guide provided to prevent said wafer from shifting along a planar direction.

8. A wafer holder according to claim 1, wherein:

said wafer supporting portion is provided over an area of the front surface of said wafer other than an area where a resist pattern is to be formed.

* * * * *